United States Patent
Hara et al.

(10) Patent No.: US 12,452,963 B2
(45) Date of Patent: Oct. 21, 2025

(54) CERAMIC HEATER

(71) Applicant: NGK INSULATORS, LTD., Nagoya (JP)

(72) Inventors: Tomohiro Hara, Handa (JP); Yutaka Unno, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 948 days.

(21) Appl. No.: 17/455,238

(22) Filed: Nov. 17, 2021

(65) Prior Publication Data

US 2022/0174788 A1    Jun. 2, 2022

(30) Foreign Application Priority Data

Nov. 30, 2020 (JP) .................. 2020-197814

(51) Int. Cl.
| | |
|---|---|
| H05B 3/18 | (2006.01) |
| H01L 21/67 | (2006.01) |
| H05B 3/06 | (2006.01) |
| H05B 3/28 | (2006.01) |

(52) U.S. Cl.
CPC ......... *H05B 3/18* (2013.01); *H01L 21/67103* (2013.01); *H05B 3/06* (2013.01); *H05B 3/283* (2013.01); *H05B 2203/003* (2013.01); *H05B 2203/007* (2013.01); *H05B 2203/017* (2013.01)

(58) Field of Classification Search
None
See application file for complete search history.

(56) References Cited

U.S. PATENT DOCUMENTS

| | | |
|---|---|---|
| 5,331,134 A | 7/1994 | Kimura |
| 2003/0062359 A1 | 4/2003 | Ho et al. |
| 2003/0075537 A1 | 4/2003 | Okajima et al. |
| 2006/0000822 A1 | 1/2006 | Nakamura |
| 2018/0047606 A1 | 2/2018 | Kin et al. |
| 2018/0090349 A1* | 3/2018 | Kurano ............ H01L 21/68792 |

(Continued)

FOREIGN PATENT DOCUMENTS

| | | |
|---|---|---|
| CN | 1695230 A | 11/2005 |
| JP | H05-326112 A | 12/1993 |

(Continued)

OTHER PUBLICATIONS

WO 2018/230408 A1 (Shinma, Kenji et al.) Dec. 20, 2018 [retrieved on Nov. 16, 2024]. Retrieved from Foreign Image and Text database, translation by Clarivate Analytics. (Year: 2018).*

(Continued)

*Primary Examiner* — John J Norton
(74) *Attorney, Agent, or Firm* — BURR PATENT LAW, PLLC

(57) ABSTRACT

A ceramic heater includes a disc-shaped ceramic plate having a wafer placement surface, and a shaft provided on a surface on an opposite side of the wafer placement surface of the ceramic plate. First and second resistance heating elements are embedded inside the ceramic plate. When the ceramic plate is viewed from above, the gap (first gap) between first turn-back sections which face each other in a circumferential direction, and the gap (second gap) between second turn-back sections which face each other in a circumferential direction are arranged so as not to overlap.

5 Claims, 11 Drawing Sheets

(56) References Cited

U.S. PATENT DOCUMENTS

| | | | |
|---|---|---|---|
| 2021/0243850 A1 | 8/2021 | Ishikawa et al. | |
| 2022/0039212 A1 | 2/2022 | Jung | |

FOREIGN PATENT DOCUMENTS

| | | | |
|---|---|---|---|
| JP | 2003-133195 | A | 5/2003 |
| JP | 2004-031593 | A | 1/2004 |
| JP | 2006-500789 | A | 1/2006 |
| KR | 10-1240774 | B1 | 2/2013 |
| KR | 10-2017-0128604 | A | 11/2017 |
| KR | 10-2019-0053941 | A | 5/2019 |
| KR | 10-2020-0018433 | A | 2/2020 |
| TW | 202017127 | A | 5/2020 |
| WO | 2004/032187 | A2 | 4/2004 |
| WO | 2018/230408 | A1 | 12/2018 |
| WO | 2020/153079 | A1 | 7/2020 |

OTHER PUBLICATIONS

Japanese Office Action (with English translation) dated Jun. 6, 2023 (Application No. 2020-197814).
Korean Office Action (Application No. 10-2021-0159955) dated Aug. 22, 2023 (with English translation) (11 pages).
Korean Notice Regarding Providing Information by a Third Party dated Jan. 30, 2024 (Application No. 10-2021-0159955).
Chinese Office Action (with English translation) dated Jan. 2, 2024 (Application No. 202111436453.5).
Taiwanese Office Action (Application No. 110144369) dated Nov. 18, 2022 (7 pages).
Japanese Office Action (with English translation) dated Mar. 28, 2023 (Application No. 2020-197814).
Korean Office Action (with English translation) dated Jan. 2, 2025 (Application No. 10-2021-0159955).
Korean Office Action (Application No. 10-2021-0159955) dated Jul. 28, 2025 (with English translation) (15 pages).

* cited by examiner

CERAMIC HEATER

BACKGROUND OF THE INVENTION

1. Field of the Invention

The present invention relates to a ceramic heater.

2. Description of the Related Art

In a semiconductor manufacturing device, a ceramic heater to heat a wafer is used. A so-called 2-zone heater is known as such a ceramic heater. As disclosed in PTL 1, as this type of 2-zone heater, a heater is known in which an inner-peripheral-side resistance heating element and an outer-peripheral-side resistance heating element are embedded in a ceramic plate on the same plane, and heat generation from each resistance heating element is controlled independently by applying a voltage to each resistance heating element independently. The inner-peripheral-side resistance heating element is wired in a circular region at the center, and the outer-peripheral-side resistance heating element is wired in an annular region outside the circular region. A jumper wire is provided in an interval from each of a pair of terminals provided in a central section of the ceramic plate to an end of the outer-peripheral-side resistance heating element. In contrast, PTL 2 discloses a ceramic heater in which respective resistance heating elements are embedded in two different planes in a ceramic plate.

CITATION LIST

Patent Literature

PTL 1: JP 2003-133195 A
PTL 2: WO 2020/153079 A1

SUMMARY OF THE INVENTION

In the ceramic heater of PTL 1, when the outer-peripheral-side resistance heating element is caused to generate heat in order to adjust a temperature distribution, heat is also generated from the jumper wire, thus a target temperature distribution may not be obtained. In contrast, in the ceramic heater of PTL 2, any jumper wire can be eliminated, thus a problem associated with heat generation of a jumper wire is solved. In PTL 2, when the ceramic plate is viewed from above, the resistance heating element in each plane is wired from one of a pair of terminals provided near the center of the ceramic plate to the other of the pair of terminals in a one-stroke pattern while being turned back at multiple turn-back sections. However, when the ceramic plate is viewed from above, the gaps each between two of return-back sections provided in each plane overlap at the same position. Therefore, a hot spot or a cool spot is likely to occur at positions of the wafer placement surface, which are immediately above the gaps each between two of the turn-back sections, thus a target temperature distribution may not be obtained.

The present invention has been devised to solve such a problem, and it is a main object to make it easy to achieve a target temperature distribution in a ceramic heater in which respective resistance heating elements are embedded in different planes of a ceramic plate.

A ceramic heater of the present invention comprising: a disc-shaped ceramic plate having a wafer placement surface; a shaft provided on a surface on an opposite side of the wafer placement surface of the ceramic plate; a first resistance heating element which is embedded in a first plane parallel to the wafer placement surface and inside the ceramic plate, and has a shape in a one-stroke pattern from one of a pair of first terminals provided in a region surrounded by the shaft to the other first terminal with turned back at multiple first turn-back sections; and a second resistance heating element which is embedded in a second plane different from the first plane, parallel to the wafer placement surface and inside the ceramic plate, and has a shape in a one-stroke pattern from one of a pair of second terminals provided in the region surrounded by the shaft to the other second terminal with turned back at multiple second turn-back sections. When the ceramic plate is viewed from above, gaps each between two of the first turn-back sections which face each other in a circumferential direction and gaps each between two of the second turn-back sections which face each other in a circumferential direction are arranged so as not to overlap.

In the ceramic heater, when the ceramic plate is viewed from above, the gaps each between two of the first turn-back sections of the first resistance heating element embedded in the first plane, and the gaps each between two of the second turn-back sections of the second resistance heating element embedded in the second plane are arranged so as not to overlap. Therefore, the occurrence of a hot spot and a cool spot is reduced, as compared with when the gaps each between two of the first turn-back sections and the gaps each between two of the second turn-back sections overlap. Therefore, a target temperature distribution is likely to be achieved.

Note that "parallel" also refers to substantially parallel (for example, within a range of tolerance) in addition to completely parallel.

In the ceramic heater of the present invention, the ceramic plate may be divided into an inner zone and an outer zone by a boundary which is a concentric circle of the ceramic plate, one of the first resistance heating element and the second resistance heating element may be an inner zone weighted heating element for which an amount of heat generation in the inner zone is greater than an amount of heat generation in the outer zone, and the other of the first resistance heating element and the second resistance heating element may be an outer zone weighted heating element for which the amount of heat generation in the outer zone is greater than the amount of heat generation in the inner zone. In this manner, temperature adjustment of the inner zone is mainly made by the inner zone weighted heating element, and temperature adjustment of the outer zone is mainly made by the outer zone weighted heating element, thus a target temperature distribution is more likely to be achieved.

Note that the diameter of the inner zone may be equal to or less than the outer diameter of the shaft, but is preferably greater than the outer diameter of the shaft. The diameter of the outer edge of the inner zone weighted heating element may be equal to or less than the diameter of the outer edge of the outer zone weighted heating element. The area covered by the inner zone weighted heating element may be equal to or less than the area covered by the outer zone weighted heating element.

In the ceramic heater of the present invention, the inner zone weighted heating element may not be disposed in the outer zone, but may be disposed in the inner zone, and the outer zone weighted heating element may be disposed in the inner zone and the outer zone. In this case, the amount of heat generation in the outer zone by the inner zone weighted heating element is zero. In this manner, the effect of heat generation in the inner zone weighted heating element on the outer zone is reduced, thus a temperature distribution with a high temperature gradient between the inner zone and the outer zone is more likely to be achieved.

In the ceramic heater of the present invention, the angle formed by the center line of each of the gaps of the first turn-back sections and the center line of each of the gaps of the second turn-back sections is preferably 20° or more. In this manner, the occurrence of a hot spot and a cool spot is more likely to be reduced.

In the ceramic heater of the present invention, the center lines of the gaps each between two of the multiple first turn-back sections may point in at least two directions, and the center lines of the gaps each between two of the multiple second turn-back sections may point in at least two directions. In this manner, as compared with when the center lines of the gaps each between two of the multiple first turn-back sections point in the same direction, and the center lines of the gaps each between two of the multiple second turn-back sections point in the same direction, the effect of those gaps on the temperature distribution can be reduced.

In the ceramic heater of the present invention, the first resistance heating element may be provided in each of divided sector planes obtained by dividing the first plane into multiple sectors, or provided in the first plane, may be wired from one of the pair of first terminals to an outer periphery of the ceramic plate while being turned back, then wired from the outer periphery to the other of the pair of first terminals while being turned back, and the second resistance heating element may be provided in each of divided sector planes obtained by dividing the second plane into multiple sectors, or provided in the second plane, may be wired from one of the pair of second terminals to the outer periphery while being turned back, then wired from the outer periphery to the other of the pair of second terminals while being turned back.

In the ceramic heater of the present invention, when the ceramic plate is viewed from above, a wire of the first resistance heating element may be disposed between (for example, in the middle of) wires of the second resistance heating element. In this manner, a target temperature distribution is more likely to be obtained.

DETAILED DESCRIPTION OF THE INVENTION

Figure 1:
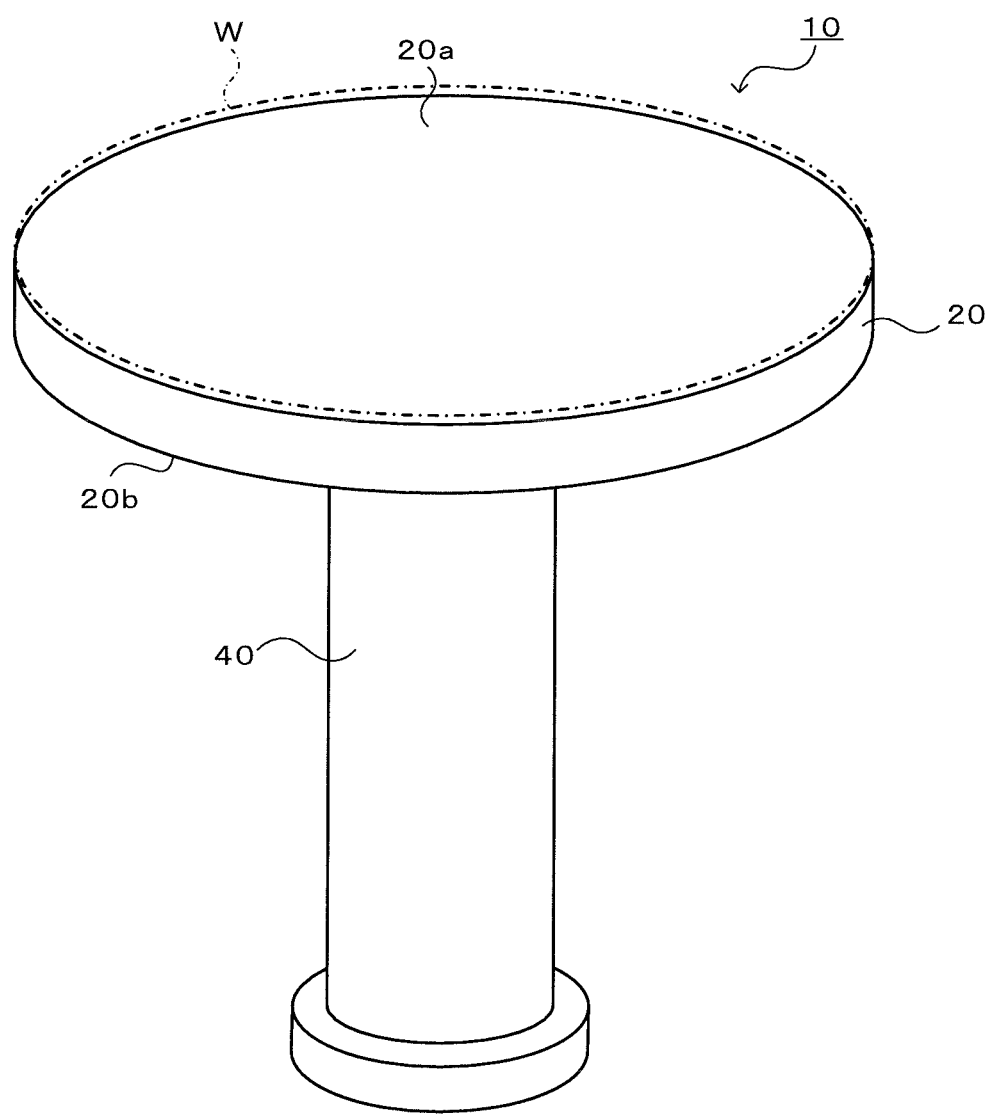
FIG. 1 is a perspective view of a ceramic heater 10.
Figure 2:
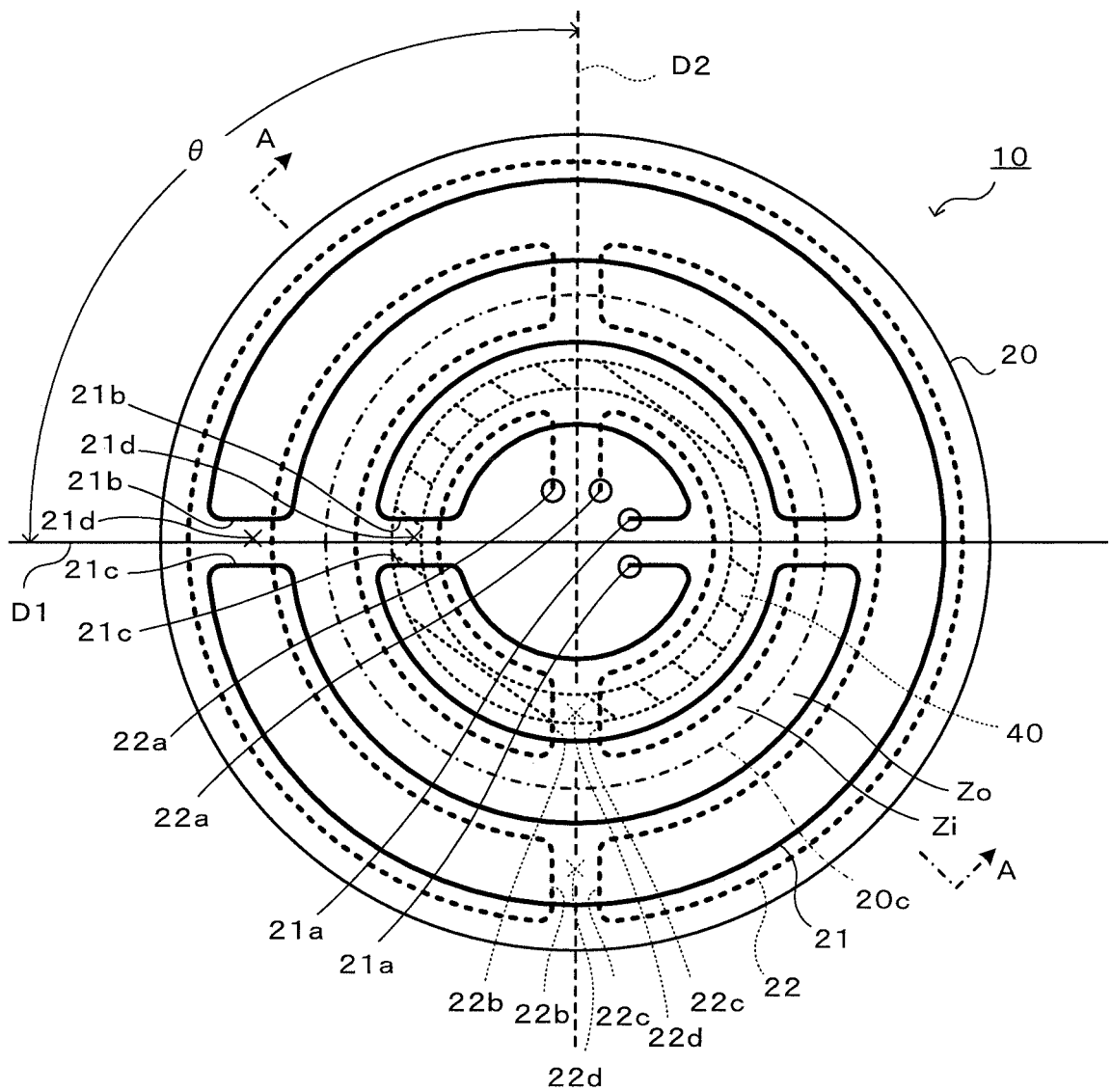
FIG. 2 is a plan view of the ceramic heater 10.
Figure 3:
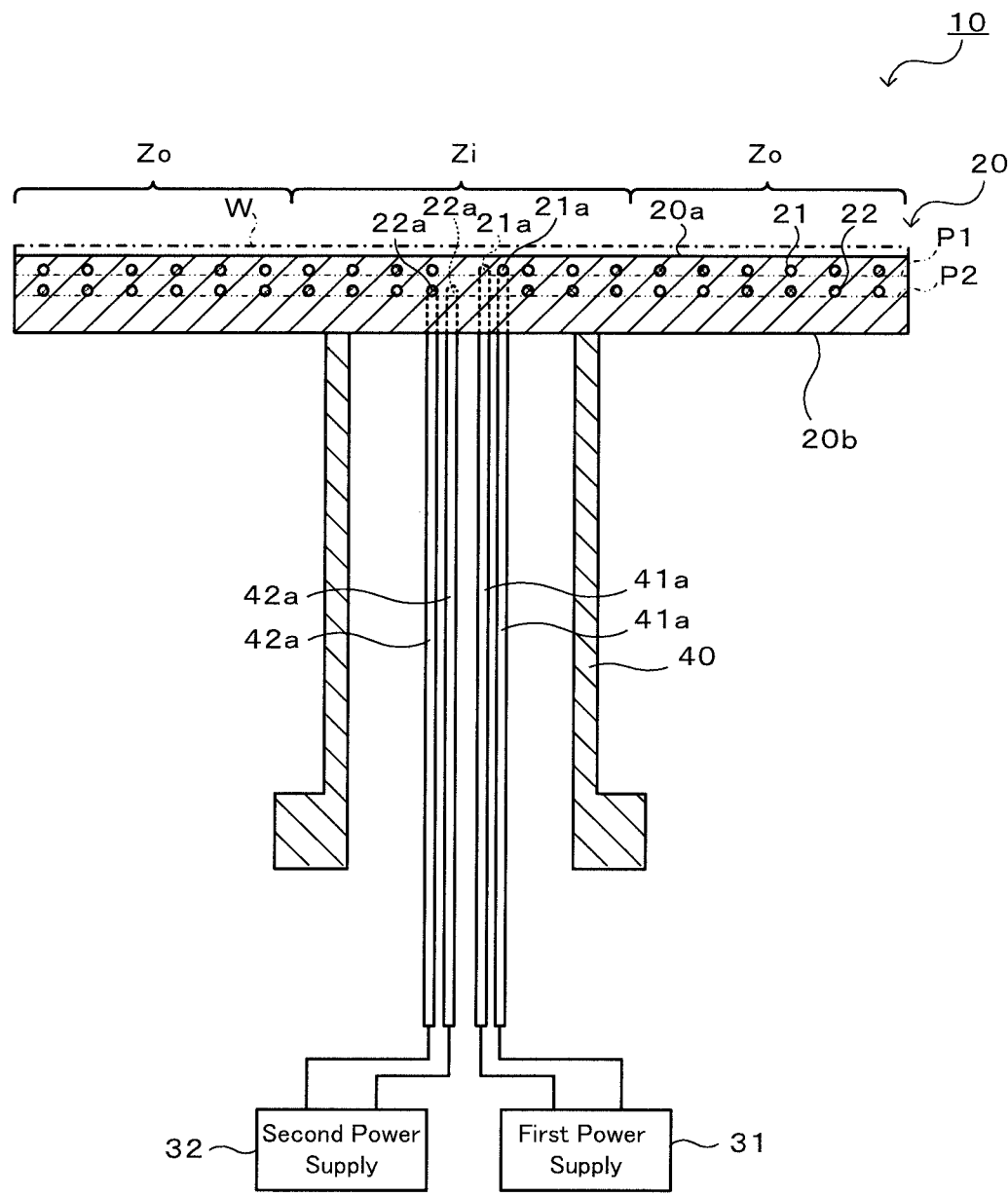
FIG. 3 is a cross-sectional view taken along A-A of FIG. 2.
Figure 4:
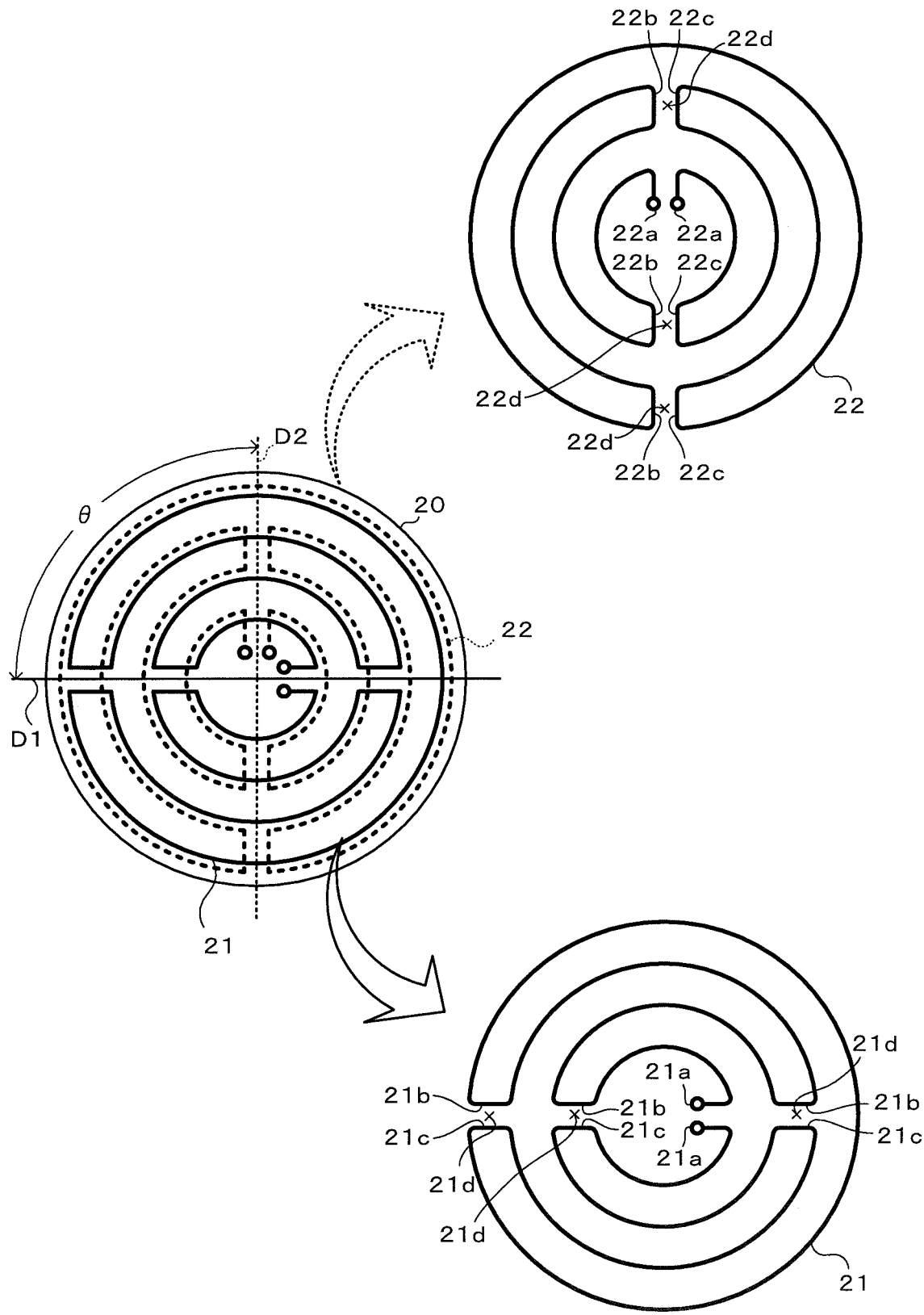
FIG. 4 shows explanatory views of first and second resistance heating elements 21, 22.

A preferred embodiment of the present invention will be described below with reference to the drawings. FIG. 1 is a perspective view of a ceramic heater 10, FIG. 2 is a plan view of the ceramic heater 10, FIG. 3 is a cross-sectional view taken along A-A of FIG. 2, FIG. 4 shows explanatory views of first and second resistance heating elements 21, 22. Note that in FIG. 2, for the sake of convenience, the first resistance heating element 21 is shown by a solid line, and dotted line hatching is applied to a shaft 40. FIG. 4 shows a plan view of the ceramic plate 20 at the left center, a plan view of the first resistance heating element 21 at the lower right, and a plan view of the second resistance heating element 22 at the upper right.

The ceramic heater 10 is used to heat a wafer W on which processing, such as etching or CVD, is to be performed, and is installed within a not-illustrated vacuum chamber. The ceramic heater 10 includes the ceramic plate 20 that is in the form of a disk and has the wafer placement surface 20a, and a tubular shaft 40 that is joined, coaxially with the ceramic plate 20, to a surface (rear surface) 20b of the ceramic plate 20 on the opposite side to the wafer placement surface 20a.

The ceramic plate 20 is a disc-shaped plate composed of a ceramic material represented by aluminum nitride and alumina. The diameter of the ceramic plate 20 is approximately 300 mm, for example. Although not illustrated, the wafer placement surface 20a of the ceramic plate 20 may be provided with fine irregularities by embossing. As shown in FIG. 3, the ceramic plate 20 has a virtual first plane P1 parallel to the wafer placement surface 20a, and a virtual second plane P2 parallel to the first plane P1. The distance from the wafer placement surface 20a to the second plane P2 is longer than the distance from the wafer placement surface 20a to the first plane P1. In other words, the first plane P1 is between the second plane P2 and the wafer placement surface 20a. The ceramic plate 20 is divided into an inner zone Zi and an outer zone Zo by a boundary 20c (see FIG. 2) which is a circle concentric with the ceramic plate 20. The diameter of the boundary 20c is approximately 200 mm, for example. The inner zone Zi is a circular region inside the boundary 20c, and the outer zone Zo is an annular region outside the boundary 20c. The first plane P1 of the ceramic plate 20 is provided with the first resistance heating element 21. The second plane P2 of the ceramic plate 20 is provided with the second resistance heating element 22. In the present embodiment, the diameter (the diameter of the boundary 20c) of the inner zone Zi is greater than the outer diameter of the shaft 40.

As shown in FIG. 2 and FIG. 4, the first resistance heating element 21 is formed so that it is wired from one of a pair of first terminals 21a, 21a provided in a central section (a region in the rear face 20b of the ceramic plate 20, the region being surrounded by the shaft 40) of the ceramic plate 20 to substantially the entire area of the first plane P1 in a one-stroke pattern while being turned back then reaches the other of the pair of first terminals 21a, 21a. Specifically, the first resistance heating element 21 is wired from the one first terminal 21a to the outer periphery of the ceramic plate 20 while being turned back at multiple first turn-back sections 21b, and after reaching the outer periphery of the ceramic plate 20, the first resistance heating element 21 is wired from the outer periphery to the other first terminal 21a while being turned back at multiple first-turn-back sections 21c. One first turn-back section 21b faces one first turn-back section 21c in a circumferential direction. First gaps 21d are each provided between a first turn-back section 21b and a first turn-back section 21c which face each other in a circumferential direction. The first resistance heating element 21 is a coil primarily composed of high melting point metal or carbide thereof. The high melting point metal includes, for example, tungsten, molybdenum, tantalum, platinum, rhenium, hafnium, and alloy of these. The carbide of high melting point metal includes, for example, tungsten carbide and molybdenum carbide. The first resistance heating element 21 is wired so that the amount of heat generation in the inner zone Zi is greater than the amount of heat generation in the outer zone Zo. Herein, the first resistance heating element 21 has the same coil diameter throughout the entire length, however, is wired so that the number of turns of coil per unit length is greater in the inner zone Zi than in the outer zone Zo. Thus, the first resistance heating element 21 is an inner zone weighted heating element.

As shown in FIG. 2 and FIG. 4, the second resistance heating element 22 is formed so that it is wired from one of a pair of second terminals 22a, 22a provided in the central section of the ceramic plate 20 to substantially the entire area of the second plane P2 in a one-stroke pattern while being turned back then reaches the other of the pair of second terminals 22a, 22a. Specifically, the second resistance heating element 22 is wired from the one second terminal 22a to the outer periphery of the ceramic plate 20 while being turned back at multiple second turn-back sections 22b, and after reaching the outer periphery of the ceramic plate 20, the second resistance heating element 22 is wired from the outer periphery to the other second terminal 22a while being turned back at multiple second turn-back sections 22c. One second turn-back section 22b faces one second turn-back section 22c in a circumferential direction. Second gaps 22d are each provided between a second turn-back section 22b and a second turn-back section 22c which face each other in a circumferential direction. Like the first resistance heating element 21, the second resistance heating element 22 is a coil primarily composed of high melting point metal or carbide thereof. The second resistance heating element 22 is wired so that the amount of heat generation in the outer zone Zo is greater than the amount of heat generation in the inner zone Zi. Herein, the second resistance heating element 22 has the same coil diameter throughout the entire length, however, is wired so that the number of turns of coil per unit length is greater in the outer zone Zo than in the inner zone Zi. Thus, the second resistance heating element 22 is an outer zone weighted heating element.

When the ceramic plate 20 is viewed from above, the first gaps 21d and the second gaps 22d are arranged so as not to overlap as shown in FIG. 2. The angle θ formed by the center line of each first gap 21d and the center line of each second gap 22d is preferably 20° or more, and is 90° herein. Note that the angle θ is to be measured on a side so as not to exceed 180°. In the present embodiment, the multiple first gaps 21d are arranged in a diameter direction D1 of the ceramic plate 20, the multiple second gaps 22d are arranged in a diameter direction D2 of the ceramic plate 20, and the angle formed by the two diameter directions D1, D2 is the angle θ.

The shaft 40 is made of ceramics such as aluminum nitride, alumina like the ceramic plate 20. The inner diameter of the shaft 40 is, for example, approximately 40 mm, and the outer diameter is, for example, approximately 60 mm. The upper end of the shaft 40 is diffusion-bonded to the ceramic plate 20. As shown in FIG. 3, first power supply rods 41a, 41a are disposed inside the shaft 40, which are respectively connected to the pair of first terminals 21a, 21a of the first resistance heating element 21. In addition, second power supply rods 42a, 42a are disposed inside the shaft 40, which are respectively connected to the pair of second terminals 22a, 22a of the second resistance heating element 22. The first power supply rods 41a, 41a are connected to a first power supply 31, and the second power supply rods 42a, 42a are connected to a second power supply 32.

Next, an example of use of the ceramic heater 10 will be described. First, the ceramic heater 10 is installed in a vacuum chamber which is not illustrated, and a wafer W is placed on the wafer placement surface 20a of the ceramic heater 10. The electric power supplied to the first and second resistance heating elements 21, 22 is adjusted by the first and second power supplies 31, 32 so that the temperature of the inner zone Zi detected by a thermocouple which is provided in the inner zone and not illustrated reaches a predetermined target temperature. Thus, the temperature of the wafer W is controlled to reach a desired temperature. The first and second power supplies 31, 32 are adjusted so that the temperature distribution of the wafer W achieves a predetermined desired temperature distribution using a wafer provided with a large number of thermocouples or a radiation thermometer. In addition to using the thermocouple for inner zone, the temperature distribution of the wafer W may be controlled by adjusting the first and second power supplies 31, 32 so that the temperature of the outer zone Zo detected by an outer-peripheral-side thermocouple for outer zone which is not illustrated reaches a predetermined outer zone target temperature. At this point, the first resistance heating element 21 is an inner zone weighted heating element, thus is primarily used to perform control so that the temperature of the inner zone Zi reaches an inner zone target temperature. The second resistance heating element 22 is an outer zone weighted heating element, thus is primarily used to perform control so that the temperature of the outer zone Zo reaches an outer zone target temperature. The inside of the vacuum chamber is then set to a vacuum atmosphere or a reduced-pressure atmosphere, a plasma is generated in the vacuum chamber, and CVD film formation is performed or etching is performed on the wafer W utilizing the plasma.

In the ceramic heater 10 of the present embodiment described above, when the ceramic plate 20 is viewed from above, the first gaps 21d each between first turn-back sections 21b, 21c of the first resistance heating element 21 embedded in the first plane P1, and the second gaps 22d each between second turn-back sections 22b, 22c of the second resistance heating element 22 embedded in the second plane P2 are arranged so as not to overlap. Thus, the occurrence of a hot spot and a cool spot is reduced, as compared with when the first gaps 21d and the second gaps 22d overlap. Therefore, a target temperature distribution is likely to be achieved.

In addition, temperature adjustment of the inner zone Zi is mainly made by the first resistance heating element 21 which is an inner zone weighted heating element, and temperature adjustment of the outer zone Zo is mainly made by the second resistance heating element 22 which is an outer zone weighted heating element, thus a target temperature distribution is more likely to be achieved.

Figure 5:
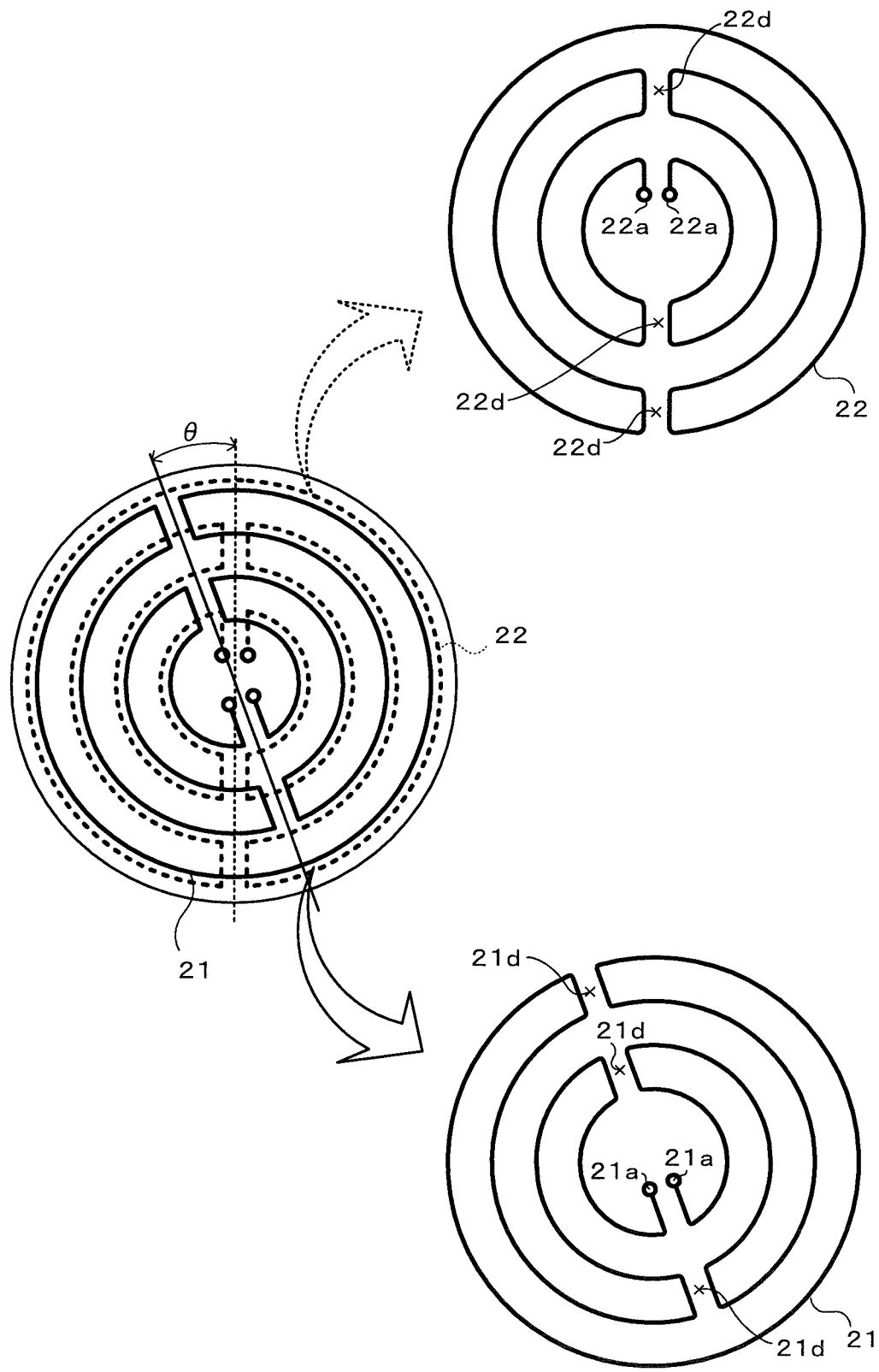
FIG. 5 shows explanatory views of other examples of the first and second resistance heating elements 21, 22.

Furthermore, the angle θ formed by the center line of each first gap 21d and the center line of each second gap 22d is preferably 20° or more. In this manner, the occurrence of a hot spot and a cool spot is more likely to be reduced. FIG. 5 shows an example in which the angle θ formed by the center line of each first gap 21d and the center line of each second gap 22d is 20°.

Note that the present invention is not particularly limited to the above-described embodiment, and it goes without saying that the present invention can be implemented in various modes as long as it belongs to the technical scope of the invention.

Figure 6:
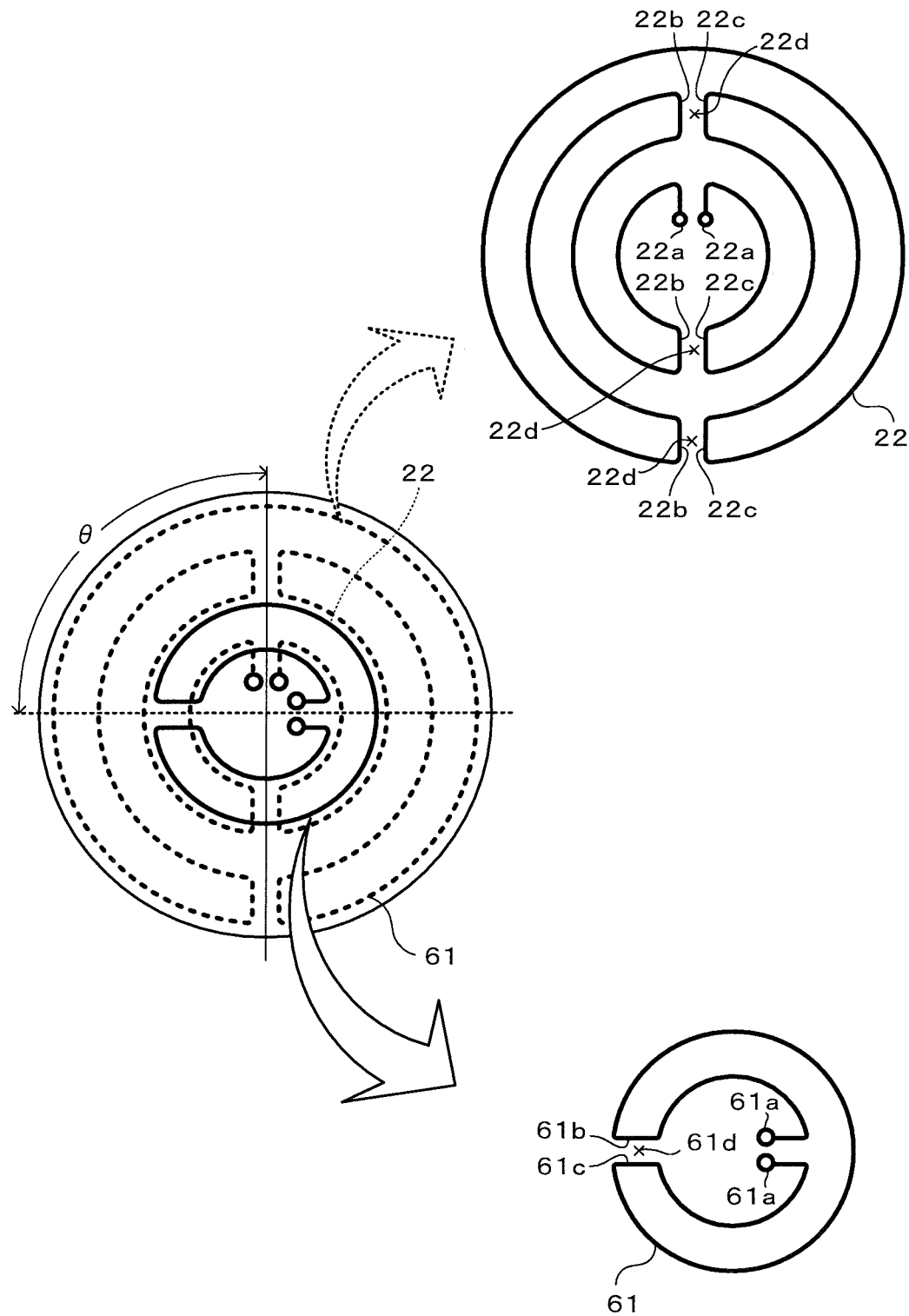
FIG. 6 shows explanatory views of first and second resistance heating elements 61, 22.

For example, a first resistance heating element 61 illustrated in FIG. 6 may be used instead of the first resistance heating element 21 of the above-described embodiment. The first resistance heating element 61 is formed so that it is wired from one of a pair of first terminals 61a, 61a provided in the central section of the ceramic plate 20 to substantially the entire area of the inner zone Zi in a one-stroke pattern while being turned back then reaches the other of the pair of first terminals 61a, 61a. Specifically, the first resistance heating element 61 is wired from the one first terminal 61a to the outer periphery of the ceramic plate 20 while being turned back at a first turn-back section 61b, and after reaching the outer periphery of the ceramic plate 20, the first resistance heating element 61 is wired from the outer periphery to the other first terminal 61a while being turned back at a first turn-back section 61c. A first gap 61d is provided between the first turn-back section 61b and the first turn-back section 61c which face each other in a circumferential direction. The first resistance heating element 61 is not disposed in the outer zone Zo, but is disposed in the inner zone Zi, thus is an inner zone weighted heating element. The angle θ formed by the center line of the first gap 61d and the center line of each second gap 22d is preferably 20° or more, and is 90° herein. In this manner, it is possible to reduce the effect on the outer zone Zo by heat generation of the first resistance heating element 61 which is an inner zone weighted heating element. In FIG. 6, the diameter of the outer edge of the first resistance heating element 61 is less than or equal to the diameter of the outer edge of the second resistance heating element 22 which is an outer zone weighted heating element, and the area covered by the first resistance heating element 61 is less than or equal to the area covered by the second resistance heating element 22.

Figure 7:
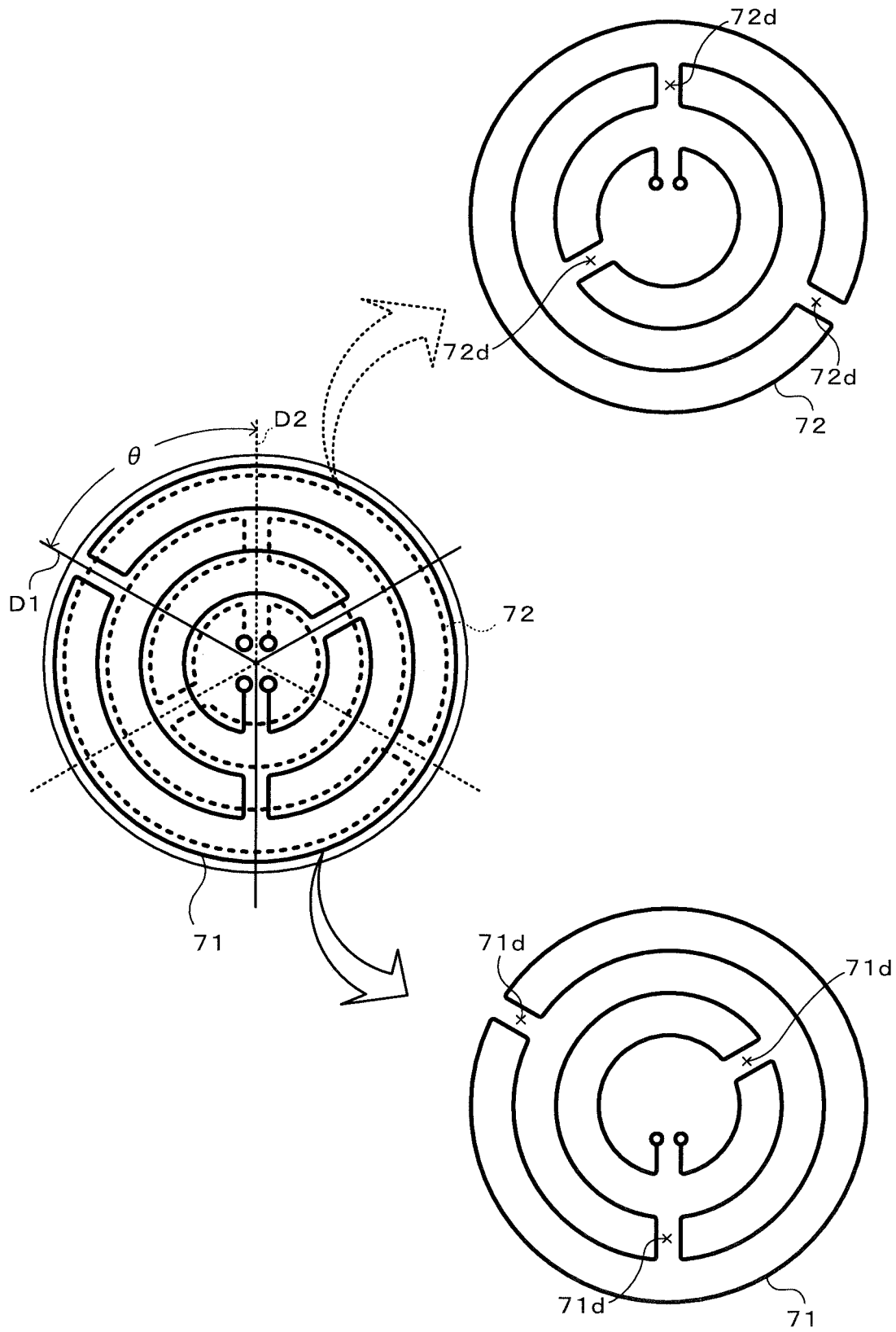
FIG. 7 shows explanatory views of first and second resistance heating elements 71, 72.
Figure 8:
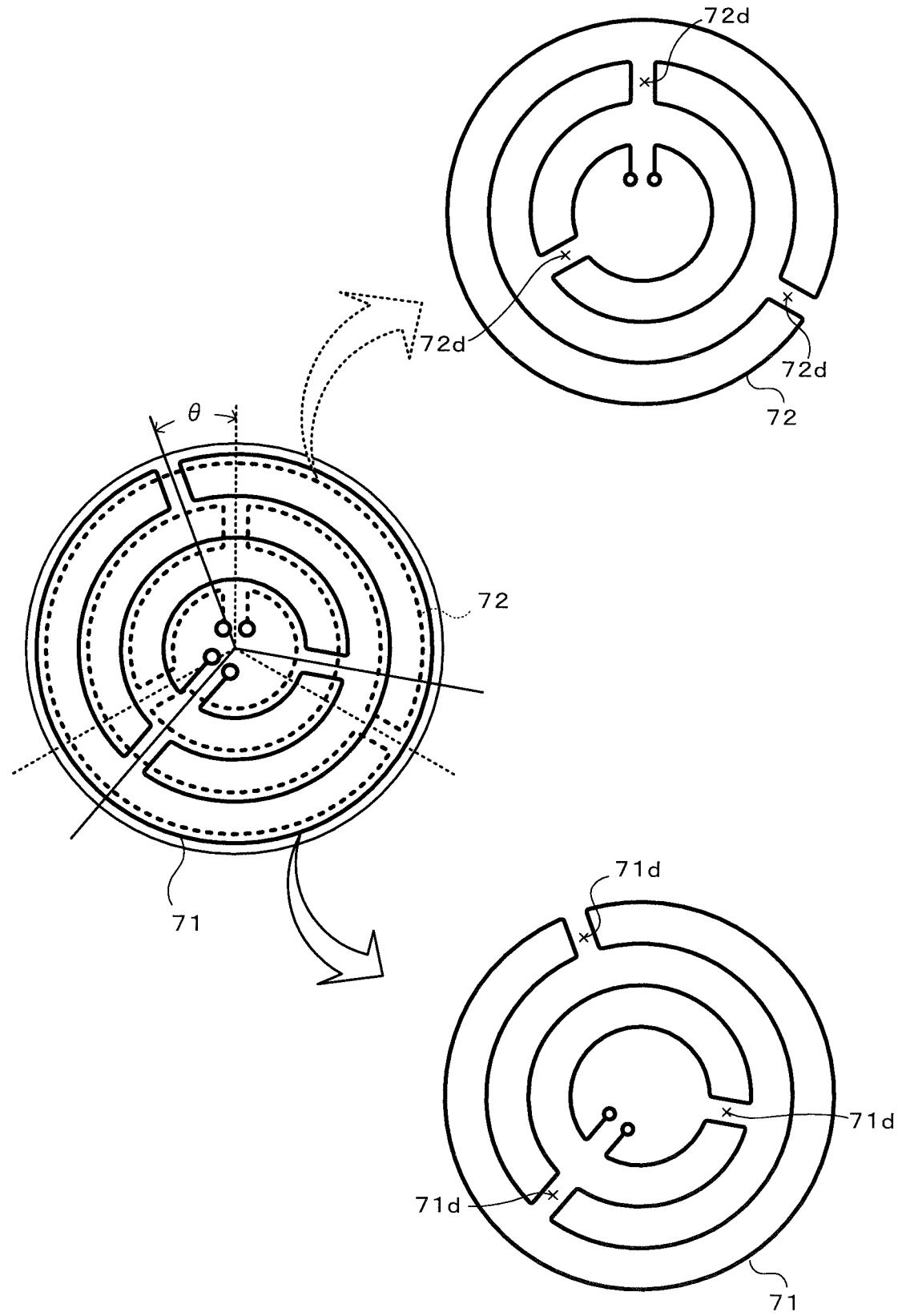
FIG. 8 shows explanatory views of other examples of the first and second resistance heating elements 71, 72.

In the embodiment described above, the center lines of multiple first gaps 21d all point in the same direction (a predetermined diameter direction), and the center lines of the second gaps 22d all point in the same direction (a diameter direction different from a predetermined diameter direction). However, without being particularly limited to this, for example, as shown in FIG. 7, multiple (herein, three) center lines of the first gaps 71d in a first resistance heating element 71 may all point in different directions, and multiple (herein, three) center lines of the second gaps 72d in a second resistance heating element 72 may all point in different directions. In FIG. 7, the angle θ formed by the center line of each first gap 71d and the center line of each second gap 72d is preferably 20° or more, and is 60° herein. In this manner, multiple second gaps 72d as well as multiple first gaps 71d are arranged in a dispersed manner, thus in contrast to the above-described embodiment, it is possible to reduce the effect of each first gap 71d and each second gap 72d on the temperature distribution. FIG. 8 shows an example in which the angle θ formed by the center line of each first gap 71d and the center line of a corresponding second gap 72d is 20°.

Figure 9:
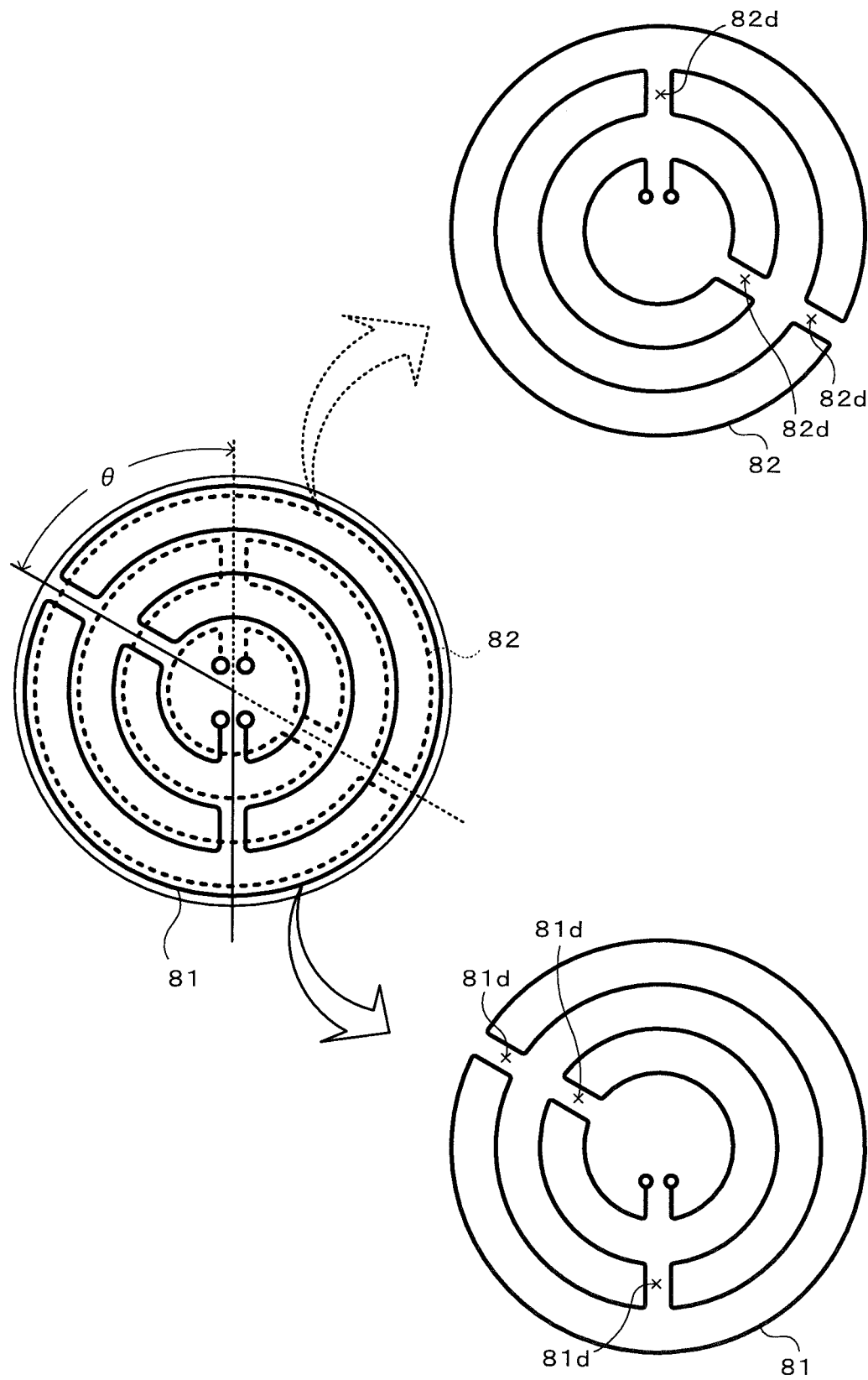
FIG. 9 shows explanatory views of first and second resistance heating elements 81, 82.

Alternatively, as shown in FIG. 9, of multiple (herein, three) center lines of first gaps 81d in a first resistance heating element 81, two center lines may point in the same direction and one center line may point in another direction, and of multiple (herein, three) center lines of second gaps 82d in a second resistance heating element 82, two center lines may point in the same direction and one center line may point in another direction. In FIG. 9, the angle θ formed by the center line of each first gap 81d and the center line of a corresponding second gap 82d is preferably 20° or more, and is 60° herein. Also in this case, multiple first gaps 81d as well as multiple second gaps 82d are arranged in a dispersed manner in part, thus in contrast to the above-described embodiment, it is possible to reduce the effect of each first gap 81d and each second gap 82d on the temperature distribution. However, the effect is higher in FIG. 7.

Figure 10:
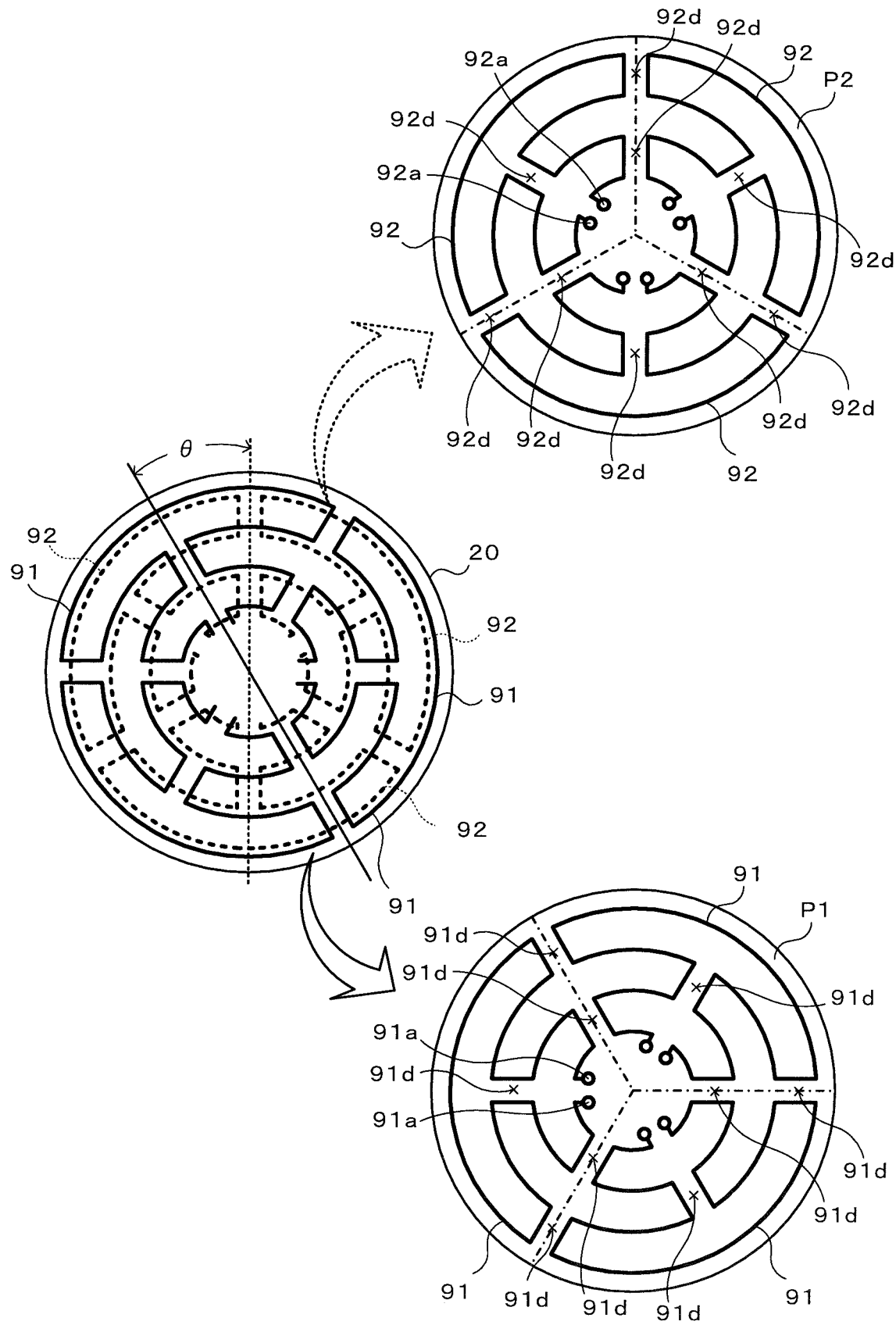
FIG. 10 shows explanatory views of first and second resistance heating elements 91, 92.

In the embodiment described above, the first plane P1 is provided with one first resistance heating element 21, and the second plane P2 is provided with one second resistance heating element 22. However, without being particularly limited to this, for example, as shown in FIG. 10, the first plane P1 may be divided into three sectors by three dotted lines, and each divided sector plane may be provided with a first resistance heating element 91. The second plane P2 may be divided into three sectors by three dotted lines, and each divided sector plane may be provided with a second resistance heating element 92. All the central angles of the divided sector planes are 120°. The first resistance heating element 91 is wired from one of a pair of first terminals 91a, 91a to the outer periphery of the ceramic plate 20 while being turned back, then is wired from the outer periphery to the other of the pair of first terminals 91a, 91a while being turned back. The second resistance heating element 92 is wired from one of a pair of second terminals 92a, 92a to the outer periphery of the ceramic plate 20 while being turned back, then is wired from the outer periphery to the other of the pair of second terminals 92a, 92a while being turned back. The angle θ formed by the center line of each first gap 91d of the first resistance heating element 91 and the center line of each second gap 92d of the second resistance heating element 92 is preferably 20° or more, and is 30° herein. In FIG. 10, the central angles of three divided sector planes are each 120°. However, without being particularly limited to this, the central angles of three divided sector planes may be different angles. Alternatively, the number of division may be two (each divided sector plane is semi-circular), or may be four or more. In FIG. 10, each divided sector plane of the first plane P1 is provided with the first resistance heating element 91, and each divided sector plane of the second plane P2 is provided with the second resistance heating element 92. However, one of the first plane P1 and the second plane P2 is not divided, and one resistance heating element may be wired on the one plane entirely.

Figure 11:
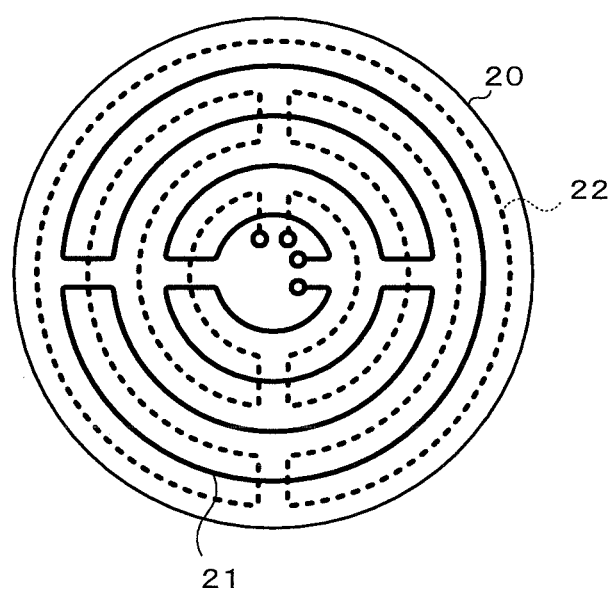
FIG. 11 shows explanatory views of other examples of the first and second resistance heating elements 21, 22.

In the embodiment described above, as shown in FIG. 11, when the ceramic plate 20 is viewed from above, the wire of the second resistance heating element 22 may be disposed between (substantially in the middle of) wires of the first resistance heating element 21. In this manner, a target temperature distribution is more likely to be obtained, as compared with the case where the wires of the first and second resistance heating elements 21, 22 are arranged to overlap when the ceramic plate 20 is viewed from above.

In the embodiment described above, the first and second resistance heating elements 21, 22 are coils, however, without being particularly limited to this, may have a two-dimensional shape like a ribbon, for example. When a ribbon has a two-dimensional shape, it can be produced by printing a paste. In the case of a two-dimensional shape, when the amount of heat generation is desired to be increased in a portion of a ribbon, the width and/or the thickness of the portion should be less than that in the other portion.

In the embodiment described above, the first resistance heating element 21 is an inner zone weighted resistance element, and the second resistance heating element 22 is an outer zone weighted resistance element. However, without being particularly limited to this, for example, the first resistance heating element 21 may be an outer zone weighted resistance element, and the second resistance heating element 22 may be an inner zone weighted resistance element.

In the embodiment described above, an electrostatic electrode may be incorporated in the ceramic plate 20. In this case, the wafer W can be electrostatically adsorbed on the wafer placement surface 20a by placing the wafer W on the wafer placement surface 20a, then applying a voltage to an electrostatic electrode. Alternatively, an RF electrode may be incorporated in the ceramic plate 20. In this case, a shower head which is not illustrated is arranged with space above the wafer placement surface 20a, and high-frequency power is supplied between parallel plate electrodes consisting of the shower head and the RF electrode. A plasma is generated in this manner, and CVD film formation can be performed or etching can be performed on the wafer W utilizing the plasma. Note that the electrostatic electrode may be used along with the RF electrode.

Examples

Examples of the present invention will be described below. Note that the examples below do not limit the present invention at all.

In the ceramic heater 10 of the embodiment described above, the angleθ of 90° provides Example 1 (see FIG. 4), the angleθ of 20° provides Example 2 (see FIG. 5), and the angleθ of zero (the first gap 21d and the second gap 22d overlap when viewed from above) provides Comparative Example 1. Note that Examples 1, 2 and Comparative Example 1 have the same structure except for the angleθ.

For Examples 1, 2 and Comparative Example 1, soaking performance evaluation experiment was performed. The ceramic heater 10 was installed in a vacuum chamber which is not illustrated, and a wafer for temperature measurement was placed on the wafer placement surface 20a. As the wafer for temperature measurement, a silicon wafer having a diameter of 300 mm was used, in which a thermocouple was embedded in each of the central point of the wafer, 12 points on the circumference with a diameter of 145 mm, and 12 points on the circumference with a diameter of 290 mm. Multiple measurement points on each circumference were arranged at regular intervals. The internal pressure of the vacuum chamber was set to 10 Pa or lower. The target temperature of the wafer W was set to 600° C. for all points. The temperature difference ΔT (° C.) was calculated by subtracting a minimum value of temperature from a maximum value of temperature at each point of the wafer for temperature measurement when the electric power supplied to the first and second resistance heating elements 21, 22 is controlled by a controller which is not illustrated so that the temperature of the wafer W matches the target temperature. The results are shown in Table 1. In Comparative Example 1, ΔT was 6° C., and in Examples 1, 2, ΔT was 2° C., 3° C., respectively. Thus, in Examples 1, 2, temperature control could be performed with higher accuracy as compared with Comparative Example 1.

TABLE 1

|  | θ (°) | ΔT (° C.) |
|---|---|---|
| Example 1 | 90 | 2 |
| Example 2 | 20 | 3 |
| Comparative Example 1 | 0 | 6 |

The present application claims priority from Japanese Patent Application No. 2020-197814, filed on Nov. 30, 2020, the entire contents of which are incorporated herein by reference.

What is claimed is:

1. A ceramic heater comprising:
a disc-shaped ceramic plate having a wafer placement surface;
a shaft provided on a surface on an opposite side of the wafer placement surface of the ceramic plate;
a first resistance heating element which is embedded in a first plane parallel to the wafer placement surface and inside the ceramic plate, and has a shape in a one-stroke pattern from one of a pair of first terminals provided in a region surrounded by the shaft to the other first terminal with turn backs at multiple first turn-back sections; and
a second resistance heating element which is embedded in a second plane different from the first plane, parallel to the wafer placement surface and inside the ceramic plate, and has a shape in a one-stroke pattern from one of a pair of second terminals provided in the region surrounded by the shaft to the other second terminal with turn backs at multiple second turn-back sections,
wherein when the ceramic plate is viewed from above, gaps each between two of the first turn-back sections which face each other in a circumferential direction and gaps each between two of the second turn-back sections which face each other in a circumferential direction are arranged so as not to overlap,
wherein when the ceramic plate is viewed from above, in all gaps of the first turn-back sections, the second resistance heating element is wired so that the second resistance heating element passes from one to the other of a pair of the first turn-back sections that form the gap of the first turn-back sections, and when the ceramic plate is viewed from above, in all gaps of the second turn-back sections, the first resistance heating element is wired so that the first resistance heating element passes from one to the other of a pair of the second turn-back sections that form the gap of the second turn-back sections,
wherein a number of the gaps of the first turn-back sections is 3 or more and a number of the gaps of the second turn-back sections is 3 or more,
wherein straight lines extending from center lines of the gaps of the first turn-back sections point in different directions that are not overlapped with each other, and straight lines extending from center lines of the gaps of the second turn-back sections point in different directions that are not overlapped with each other, and
wherein the center lines of the three or more first turn-back sections are arranged along radial directions of the ceramic plate at equal angular intervals, and the second resistance heating element has a same number of second turn-back sections as the first turn-back sections, and the center lines of each of the second turn-back sections are arranged to bisect an angle formed by the center lines of two adjacent first turn-back sections.

2. The ceramic heater according to claim 1,
wherein the ceramic plate is divided into an inner zone and an outer zone by a boundary which is a concentric circle of the ceramic plate,
one of the first resistance heating element and the second resistance heating element is an inner zone weighted heating element for which an amount of heat generation in the inner zone is greater than an amount of heat generation in the outer zone, and the other of the first resistance heating element and the second resistance heating element is an outer zone weighted heating element for which the amount of heat generation in the outer zone is greater than the amount of heat generation in the inner zone.

3. The ceramic heater according to claim 2, wherein the inner zone weighted heating element is not disposed in the outer zone, but is disposed in the inner zone, and the outer zone weighted heating element is disposed in the inner zone and the outer zone.

4. The ceramic heater according to claim 1, wherein an angle formed by the center line of each of the gaps of the first turn-back sections and the center line of each of the gaps of the second turn-back sections is 20° or more.

5. The ceramic heater according to claim 1, wherein when the ceramic plate is viewed from above, a wire of the first resistance heating element is disposed between wires of the second resistance heating element.

\* \* \* \* \*